(12) United States Patent
Han et al.

(10) Patent No.: US 7,541,282 B2
(45) Date of Patent: Jun. 2, 2009

(54) METHODS OF FORMING METAL-NITRIDE LAYERS IN CONTACT HOLES

(75) Inventors: Sung-ho Han, Seoul (KR); Rak-hwan Kim, Gyeonggi-do (KR); Kyung-in Choi, Seoul (KR); Sang-woo Lee, Seoul (KR); Gil-heyun Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 11/084,576

(22) Filed: Mar. 18, 2005

(65) Prior Publication Data

US 2005/0263890 A1  Dec. 1, 2005

(30) Foreign Application Priority Data

May 25, 2004  (KR) .................. 10-2004-0037328

(51) Int. Cl.
    *H01L 21/4763* (2006.01)
(52) U.S. Cl. .................. 438/640; 438/637; 438/643
(58) Field of Classification Search .............. 438/637, 438/643, 640
    See application file for complete search history.

(56) References Cited

U.S. PATENT DOCUMENTS

| 6,217,721 | B1 | 4/2001 | Xu et al. |
| 6,413,858 | B1 | 7/2002 | Chopra |
| 6,432,820 | B1 | 8/2002 | Lee et al. ................ 438/677 |
| 6,589,398 | B1 | 7/2003 | Lu et al. ................ 204/192.12 |
| 6,652,718 | B1 | 11/2003 | D'Couto et al. |
| 6,727,560 | B1 * | 4/2004 | Pan et al. ................ 257/412 |
| 7,074,714 | B2 * | 7/2006 | Chiang et al. ............ 438/637 |
| 2002/0192948 | A1 | 12/2002 | Chen et al. |

FOREIGN PATENT DOCUMENTS

| DE | 199 13 554 A1 | 2/2000 |
| JP | 05152445 A | 6/1993 |
| JP | 10-070093 | 10/1998 |
| KR | 10-2002-0072875 | 9/2002 |

OTHER PUBLICATIONS

English Translation of Office Action issued by the German Patent Office for Application No. 10 2005 023 670.7-33; Oct. 16, 2006.
Notice to Submit a Response for Korean Patent Application No. 10-2004-0037328 on Nov. 21, 2005.

* cited by examiner

*Primary Examiner*—Matthew Smith
*Assistant Examiner*—Sonya D McCall Shepard
(74) *Attorney, Agent, or Firm*—Myers Bigel Sibley & Sajovec

(57) ABSTRACT

A metal layer can be formed in an integrated circuit by forming a metal-nitride layer in a recess including a first concentration of nitrogen in the metal-nitride layer at a bottom of the recess that is less than a second concentration of nitrogen in the metal-nitride layer proximate an opening of the recess. A metal layer can be formed on the metal-nitride layer including in the recess.

31 Claims, 15 Drawing Sheets

METHODS OF FORMING METAL-NITRIDE LAYERS IN CONTACT HOLES

CROSS-REFERENCE TO RELATED APPLICATION

This application claims priority to Korean Patent Application No.: 2004-37328, filed in the Korean Intellectual Property Office on May 25, 2004, the contents of which are herein incorporated by reference in their entirety.

FIELD OF THE INVENTION

The invention relates to the methods for forming semi-conductor integrated circuits, and more particularly to methods of forming metal wiring layers in semi-conductor integrated circuits and layers so formed.

BACKGROUND

It is known to use a sputtering process (sometimes referred to as a physical vapor deposition) to form relatively thin layers in semi-conductor fabrication processes. For example, sputtering is sometimes used to form relatively thin metal diffusion barrier layers and/or anti-reflective layers to cap semi-conductor structures.

A schematic illustration of a conventional sputtering apparatus 100 is shown in FIG. 1. In particular, the sputtering apparatus 100 represents what is commonly referred to as a Hollow Cathode Magnetron (HCM) sputtering apparatus. Referring to FIG. 1, the HCM sputtering apparatus 100 includes a "cupped" target 102 surrounded by electromagnetic coils 106A-106H. Shields 114 extend from the cupped target 102 to a surface 112 holding a substrate 110 on which relatively thin metal layers can be deposited by the sputtering process. It will be understood that the HCM sputtering apparatus 100 is sometimes referred to as "hollow" due to the definition of an inner region 116 by the "cupped" shape of the target 102.

In operation, a vacuum is established in the inner region 116 between the cupped target 102 and the substrate 110. Argon gas is admitted to the region 116, which is ionized by a magnetic and electric field provided thereto. The ionized Argon gas is accelerated toward the cupped target 102, which causes a portion of the material that makes up the cupped target 102 to be ejected outwardly. The ejected portion of the target is directed toward the substrate 110 by fields (electric/magnetic) generated by the electromagnetic coils 106A-H. Accordingly, the material ejected from the cupped target 102 is deposited on the substrate 110. Conventional HCM sputtering apparatuses are further discussed, for example, in U.S. Pat. No. 6,589,398, to Lu et al. entitled *Pasting Method for Eliminating Flaking During Nitrite Sputtering*, the contents of which are incorporated herein by reference in its entirety.

It is known to use the conventional type of HCM apparatus discussed above to form Titanium Nitride (TiN) layers on substrates using a cupped Titanium (Ti) target using Argon (Ar) and Nitrogen ($N_2$) in the inner region 116. An applied magnetic/electric field is used to accelerate the Argon (Ar) toward the Titanium target 102 thereby causing a portion of the Titanium target to be ejected and accelerated toward the substrate 110. The ejected Titanium combines with the $N_2$ to form a TiN material that is deposited on the substrate 110. It is known to deposit such TiN materials at the bottom of contact holes in the substrate 110 to form, for example, TiN barrier layers to reduce the diffusion of conductive materials (subsequently formed in the contact holes).

In particular, it is known to operate the conventional HCM sputtering apparatus 100 to form TiN layers in one of two modes: Metallic TiN mode or poisoned TiN mode. In Metallic TiN mode the amount of Ti generally exceeds the amount of $N_2$ in the TiN layer using Ar flow rate that is much greater than the flow rate of $N_2$. For example, it is known to sputter Ti using the conventional HCM sputtering apparatus 100 using flow rates of about Ar 135 sccm and $N_2$ 28 sccm.

In contrast, in poisoned TiN mode (sometimes referred to as Nitrided TiN), the amount of Ti in the TiN is about equal to the amount of $N_2$ and the Ar flow rate is less than the $N_2$ flow rate. For example, it is known to sputter TiN in poison TiN mode using the conventional HCM sputtering apparatus 100 using an Ar flow rate of about 30 sccm and an $N_2$ flow rate of about 70 sccm (that is using an Ar flow rate that is less than the $N_2$ flow rate). It is known that the poisoned TiN mode sputtering may exhibit superior diffusion barrier layer properties compared to Metallic TiN mode sputtering.

Even with the use of the type of conventional HCM sputtering apparatus 100 discussed above in reference to FIG. 1, it is known that several types of problems may be exhibited with this approach. FIGS. 2-4 illustrate some common problems associated with contact holes formed in substrates of relatively high density integrated circuits. High density contact holes can have relatively high aspect ratios such that the depth of the contact hole is relatively deep compared to the width of the contact hole. It is known that it can be difficult to completely form conductive materials in high aspect ratio contact holes.

For example, FIG. 2 illustrates an insulating layer 205 on a substrate 200 having an impurity doped region 203 formed therein that is exposed by the contact hole. A diffusion barrier layer 207 (such as a TiN diffusion barrier layer) is formed in the contact hole and on the exposed surface of the impurity doped region 203. A conductive layer 209 is formed on the diffusion barrier layer 207 including in the contact hole. According to FIG. 2, because of the high aspect ratio of the contact hole, a void 211 may be formed in the contact hole because of the formation of an overhanging portion 215 that may block further deposition of the conductive layer 209 in the contact hole. The formation of metal layers in contact holes is also discussed, for example, in U.S. Pat. No. 6,432,820 to Lee et al., entitled *Method of Selectively Depositing a Metal Layer in an Opening in a Dielectric Layer by Forming a Metal-Deposition-Prevention Layer Around the Opening of the Dielectric Layer*, the content of which is incorporated herein by reference in its entirety.

FIG. 3 shows another type of defect that can result during deposition of conductive layers in high aspect ratio contact holes using HCM sputtering. A conductive layer 309 may be formed completely over the contact hole in an insulating layer 305 on an exposed impurity region 303 of a substrate 300, thereby forming the void 311. Accordingly, the types of defects shown in FIGS. 2 and 3 are variations of the same type of problem that can occur using conventional HCM sputtering.

FIG. 4 illustrates a contact hole 402 formed in a dielectric layer 405 on a substrate 400 that exposes a doped impurity region 403 therein. In particular, the contact hole 402 is formed in what was initially a stepped region 416 having a wider opening than the subsequently formed contact hole 402. The formation of the stepped region 416 may sometimes be formed as a measure to alleviate the problems shown above in FIGS. 2 and 3. However, use of the stepped region 416 can lead to a "shadowing" effect that can produce an overhang portion 415 in the contact hole 402 which can lead to the formation of a void in the conductive layer in the contact hole.

In particular, as shown in FIG. 4, a sidewall portion of the contact hole 402 may be left exposed such that no portion of the conductive layer 409 is deposited thereon due to the overhanging portion 415.

SUMMARY

Embodiments according to the invention can provide methods of forming metal-nitride layers in contact holes and layers so formed. Pursuant to these embodiments, a method of forming a metal layer in an integrated circuit can include forming a metal-nitride layer in a recess including a first concentration of nitrogen in the metal-nitride layer at a bottom of the recess that is less than a second concentration of nitrogen in the metal-nitride layer proximate an opening of the recess. A metal layer is formed on the metal-nitride layer including in the recess.

In some embodiments according to the invention, the metal-nitride layer is W, Ti, and/or Ta. In some embodiments according to the invention, forming a metal-nitride layer includes sputtering a titanium target for a time interval of about 3.0 seconds to about 10.0 seconds. In some embodiments according to the invention, forming a metal-nitride layer includes sputtering a titanium target using a Hollow Cathode Magnetron in metallic mode for a time interval of about 4.0 seconds to about 6.0 seconds.

In some embodiments according to the invention, forming a metal-nitride layer includes forming the metal-nitride layer with a tapered thickness including a first thickness at the bottom that is about 10 percent or less than and a second thickness proximate the opening. In some embodiments according to the invention, forming the metal-nitride layer with a tapered thickness includes forming the metal-nitride layer to provide the second thickness of about 50 Angstroms or less and the first thickness of about 5.0 Angstroms or less.

In some embodiments according to the invention, forming a metal-nitride layer includes forming the metal-nitride layer with a tapered thickness including a first thickness at the bottom and a second thickness that is greater than the first thickness proximate the opening. In some embodiments according to the invention, the tapered thickness of the metal-nitride layer has a gradually reducing thickness as the metal-nitride layer extends from the bottom toward the opening.

In some embodiments according to the invention, forming a metal-nitride layer includes forming a Ti-rich TiN layer in the recess using metallic mode Hollow-Cathode-Magnetron (HCM) sputtering. In some embodiments according to the invention, forming a Ti-rich TiN layer in the recess using metallic mode further includes introducing Ar and $N_2$ during the HCM sputtering at different flow rates.

In some embodiments according to the invention, forming a Ti-rich TiN layer in the recess using metallic mode further includes introducing Ar gas at a flow rate that is greater than a flow rate of $N_2$ gas during sputtering. In some embodiments according to the invention, introducing Ar gas at a flow rate that is greater than a flow rate of $N_2$ gas during sputtering includes introducing Ar at a rate of about 135 sccm and introducing $N_2$ at about 28 sccm.

In some embodiments according to the invention, forming a Ti-rich TiN layer in the recess using metallic mode Hollow-Cathode-Magnetron (HCM) sputtering further includes maintaining a cathode associated with a Ti target at a power of about 20 Kilowatts to about 40 Kilowatts. In some embodiments according to the invention, forming a metal-nitride layer further includes maintaining a temperature of about 250° C. and about 350° C. in an HCM inner region.

In some embodiments according to the invention, forming a metal layer includes forming a CVD-Al layer without a vacuum break relative to forming the metal-nitride layer. In some embodiments according to the invention, forming a metal layer includes forming a CVD-Al layer at a temperature of about 120° C. to about 130° C. and at a pressure of about 5.0 torr to about 10.0 torr and Ar gas provided at a flow rate of about 300 sccm to about 500 sccm.

In some embodiments according to the invention, forming a metal-nitride layer includes sputtering a Ti target onto a substrate including the recess using a greater flow of Ar compared to $N_2$ for a time interval between about 4 and 10 seconds. Sputtering the Ti target is ceased after the time interval elapses.

In some embodiments according to the invention, a method of forming a metal layer in an integrated circuit includes forming a TiN wetting layer in a recess of a substrate including a first concentration of N2 in the wetting layer at a bottom of the recess that is less than a second concentration of N2 in the wetting layer proximate an opening of the recess. A metal layer is formed on the TiN wetting layer using Chemical Vapor Deposition.

In some embodiments according to the invention, forming a TiN wetting layer includes sputtering a titanium target for a time interval of about 3.0 seconds to about 10.0 seconds. In some embodiments according to the invention, sputtering the target is ceased after the time interval.

In some embodiments according to the invention, forming a Ti wetting layer includes introducing Ar and $N_2$ gas at different flow rates during metallic mode HCM sputtering. In some embodiments according to the invention, forming a TiN wetting layer further includes introducing Ar gas at a flow rate that is greater than a flow rate of $N_2$ gas.

In some embodiments according to the invention, introducing Ar gas at a flow rate that is greater than a flow rate of $N_2$ gas during sputtering includes introducing Ar at a rate of about 135 sccm and introducing $N_2$ at about 28 sccm. In some embodiments according to the invention, forming a TiN wetting layer further includes maintaining a cathode associated with a Ti target at a power of about 20 Kilowatts to about 40 Kilowatts.

In some embodiments according to the invention, forming a metal layer includes forming a CVD-Al layer at a temperature of about 120° C. to about 130° C. and at a pressure of about 5.0 torr to about 10.0 torr and Ar gas provided at a flow rate of about 300 sccm to about 500 sccm. In some embodiments according to the invention, a method of forming a metal layer in an integrated circuit includes forming a metal-nitride layer in a recess in a substrate. A metal target is sputtered onto the substrate in an Ar/$N_2$ environment including a relatively high concentration of Ar compared to $N_2$ to form a metal-rich metal-nitride layer in the recess having a first concentration of N at a bottom that is less than a second concentration of $N_2$ at an opening of the recess. A metal layer is deposited in the recess on the metal-rich metal-nitride layer using Chemical Vapor Deposition without vacuum break relative to the sputtering.

In some embodiments according to the invention, sputtering includes sputtering a titanium target for a time interval of about 3.0 seconds to about 10.0 seconds. Sputtering the target is ceased after the time interval. In some embodiments according to the invention, sputtering further includes introducing the Ar at a flow rate that is greater than a flow rate of $N_2$ during sputtering. In some embodiments according to the invention, introducing further includes introducing the Ar at a rate of about 135 sccm and introducing the $N_2$ at about 28 sccm.

In some embodiments according to the invention, sputtering includes sputtering the metal target using metallic mode Hollow-Cathode-Magnetron (HCM) sputtering maintaining a cathode associated with target at a power of about 20 Kilowatts to about 40 Kilowatts. In some embodiments according to the invention, sputtering further includes maintaining a temperature of about 250° C. and about 350° C. in an HCM inner region. In some embodiments according to the invention, sputtering further includes depositing the metal layer in different portions of the recess at different rates.

In some embodiments according to the invention, depositing further includes depositing the metal layer at the different rates indirectly proportional to a thickness of the metal-rich metal nitride layer in the recess.

In some embodiments according to the invention, a method of forming a metal layer in an integrated circuit includes forming a metal-nitride layer at a bottom of a recess in a substrate to a first thickness and on the substrate outside the recess to a second thickness, wherein the first thickness is about less than or equal to 10 percent of the second thickness. A metal layer is formed on the layer in the recess. In some embodiments according to the invention, the first thickness is about or less than 5.0 Angstroms. In some embodiments according to the invention, the second thickness is about 100 Angstroms to about 30 Angstroms.

In some embodiments according to the invention, a method of forming a metal layer in an integrated circuit includes depositing a CVD metal layer on a tapered thickness metal-rich metal nitride layer at the different rates inside the recess indirectly proportional to a thickness of the metal-rich metal nitride layer in the recess on which the CVD metal layer is deposited.

In some embodiments according to the invention, a metal layer in an integrated circuit includes a metal-rich metal nitride layer in a recess in a substrate including a first concentration of N2 at a bottom that is less than a second concentration of $N_2$ at an opening of the recess and a CVD metal layer in the recess on the metal-rich metal-nitride layer. In some embodiments according to the invention, the metal-rich metal nitride layer is a first thickness outside the recess and a second thickness at a bottom of the recess, wherein the first thickness is about less than or equal to 10 percent of the second thickness.

DESCRIPTION OF EMBODIMENTS ACCORDING TO THE INVENTION

Figure 1:
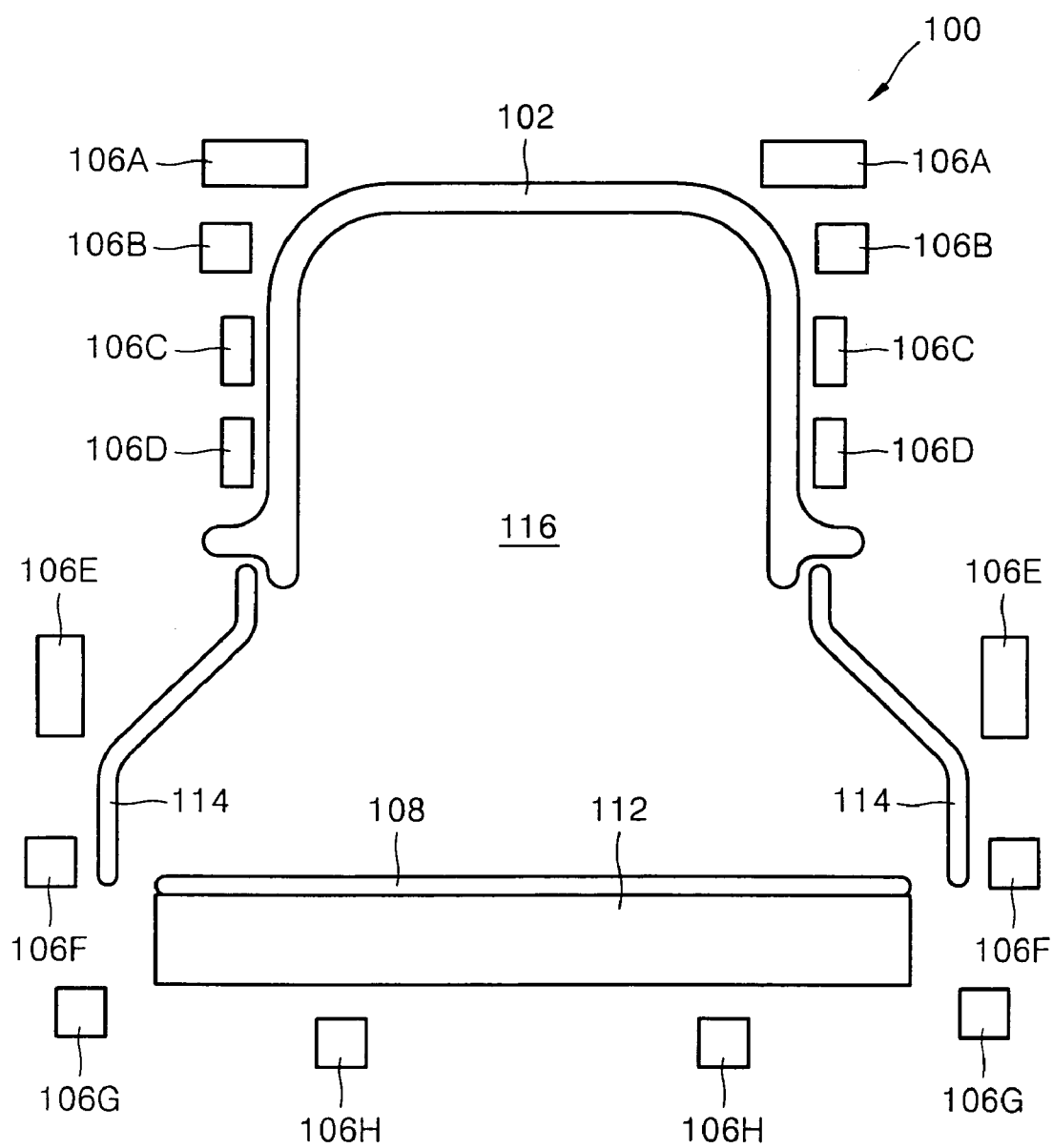
FIG. 1 is a schematic illustration of a conventional Hollow Cathode Magnetron (HCM) sputtering apparatus.
Figure 2:
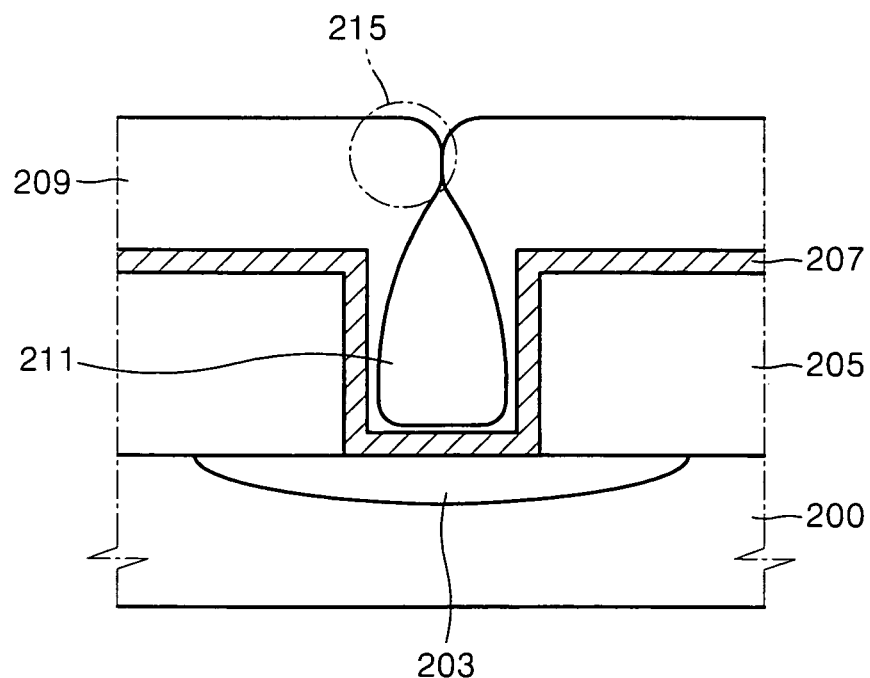
FIGS. 2-4 are cross sectional views of contact holes having conductive materials formed therein with voids formed according to conventional art.
Figure 3:
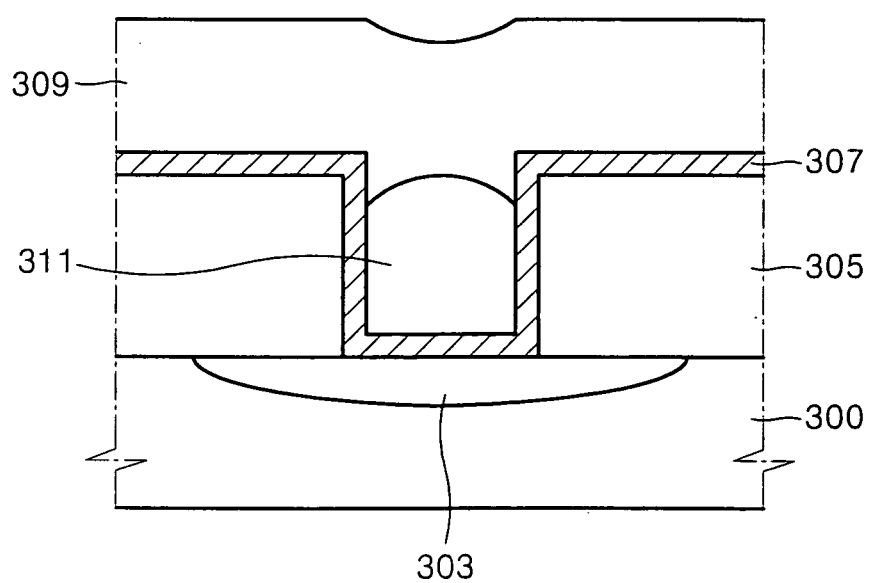
Figure 4:
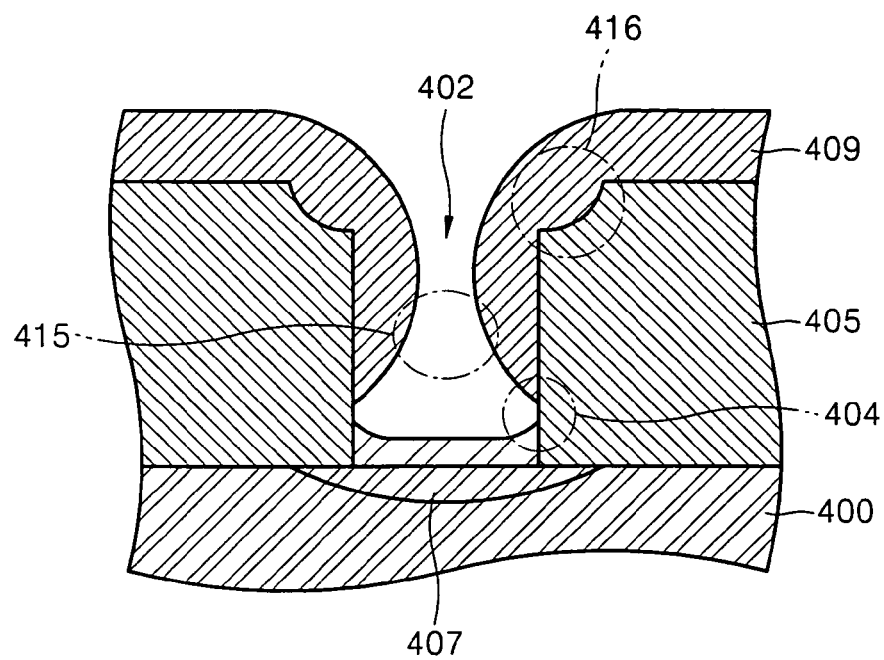

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As disclosed herein, in some embodiments according to the invention, relatively thin portions of a metal-nitride layer (e.g., portions having a thickness of about 5.0 Angstroms or less) and/or portions having relatively low concentrations of nitrogen compared to other portions, can provide a relatively large number of nucleation sites. The relatively large number of nucleation sites can promote the subsequent formation of a CVD-Al layer at the bottom of the contact hole to reduce the likelihood that growth of the CVD-Al near the opening of the contact hole will close the contact hole before the formation of the CVD-Al inside the contact hole is complete (i.e., fills any void in the contact hole 522).

Figure 5:
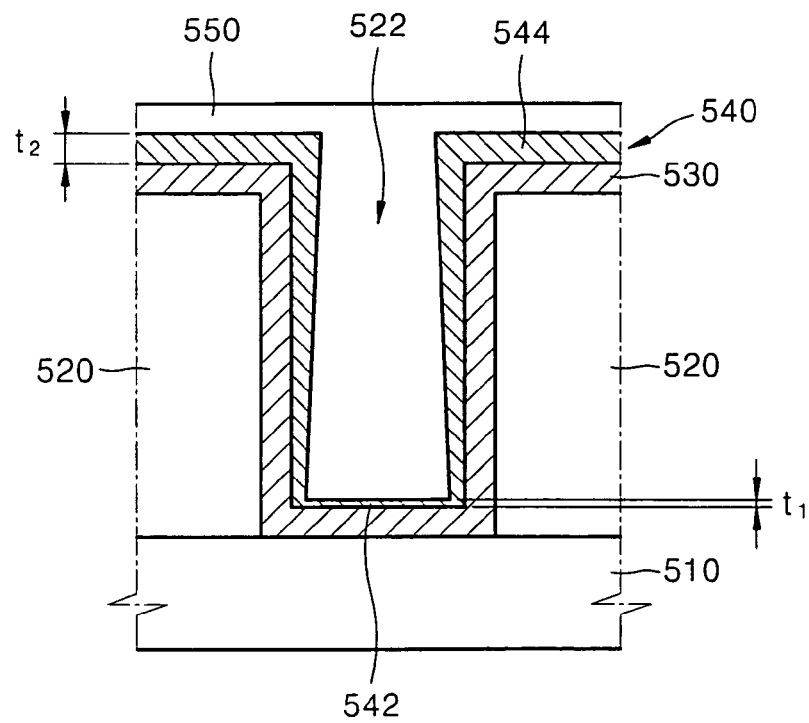
FIG. 5 is a cross sectional view of a contact hole including a barrier metal layer according to some embodiments in the invention.

FIG. 5 is a cross sectional diagram showing a tapered thickness metal-nitride barrier layer in a contact hole having varying concentrations of nitrogen therein according to some embodiments of the invention. In particular, a contact hole 522 in an interlayer dielectric layer 520 includes a barrier metal layer 530 formed therein. A metal-nitride barrier layer 540 is formed on the barrier metal layer 530 in the contact hole 522. As shown in FIG. 5, the thickness of the metal-nitride barrier layer 540 is tapered on the sidewall in the contact hole 522 so that a thickness $t_1$ of a portion 542 of the metal-nitride barrier layer 540 at a bottom of the contact hole 522 is less than a thickness $t_2$ of a portion 544 of the metal-nitride barrier layer 540 outside the contact hole 522 (for example, on an upper surface of the barrier metal layer 530). In some embodiments according to the invention, the barrier metal layer 530 is Ti or a multi-layered Ti/TiN structure. In some embodiments according to the invention, the metal-nitride barrier layer 540 is a Ti-rich TiN layer. As used herein, the term "Ti-rich TiN" includes Hollow Cathode Magnetron (HCM) metallic mode TiN layers. In particular, Ti-rich refers to the stoichiometry of the deposited TiN layer in the contact hole of the substrate being such that more Ti is included in the TiN layer than $N_2$.

As shown in FIG. 5, the thickness of the metal-nitride barrier layer 540 is gradually reduced along the sidewall of the contact hole 522 extending from an opening thereof toward a bottom of the contact hole 522. In some embodiments according to the invention, the thickness $t_1$ of the metal-nitride barrier layer 540 at the portion 542 is less about (or less than) 10% of the thickness $t_2$ of the portion 544 of the metal-nitride barrier layer 540. For example, in some embodiments according to the invention, the thickness of the portion 544 of a Ti-rich TiN layer 540 is about 50 Angstroms, whereas the thickness of the portion 542 of the Ti-rich TiN layer 540 is about 5.0 Angstroms or less.

It will be understood that the relatively thin portions of the Ti-rich TiN layer 540 (e.g., the portion having a thickness of about 5.0 Angstroms or less) can provide a relatively large number of nucleation sites (and can in some embodiments according to the invention, expose the underlying Ti/TiN layer). For example, a very thin Ti-rich TiN layer 540 may partially expose an underlying CVD-Ti/TiN layer which may more readily promote the deposition of the CVD-Al compared to the barrier metal layer 530, such as a Ti/TiN layer. The relatively large number of nucleation sites can promote the subsequent formation of a CVD-Al layer at the bottom of the contact hole 522 to reduce the likelihood that growth of the CVD-Al near the opening of the contact hole 522 will close the contact hole 522 before the formation of the CVD-Al inside the contact hole 522 is complete (i.e., fills any void in the contact hole 522).

It will be understood that in some embodiments according to the invention, the concentration of $N_2$ in the Ti-rich TiN layer 540 is greater in the portion 544 than in the portion 542. In other words, in some embodiments according to the invention, the concentration of $N_2$ in the Ti-rich TiN layer 540 is greater outside the contact hole 522 than inside the contact hole 522 and, particularly, at the bottom of the contact hole 522 at the portion 542. It will be further understood that in some embodiments according to the invention, the $N_2$ concentration in the Ti-rich TiN layer 540 varies along with the tapered thickness of the Ti-rich TiN layer 540 on the sidewall of the contact hole 522.

In some embodiments according to the invention, the varied concentration of $N_2$ in the Ti-rich TiN layer 540 can also affect the growth rate of a CVD-Al layer thereon. In particular, the CVD-Al layer may be more readily deposited on the portions of the Ti-rich TiN layer 540 including the relatively low concentrations of $N_2$ compared to the portions including the greater concentrations. Accordingly, the CVD-Al may be deposited faster on the portions of the Ti-rich TiN layer 540 including the lower concentrations of $N_2$ (e.g., at the bottom of the contact hole 522) compared to the portions with the greater concentrations of $N_2$ (e.g., outside the contact hole 522).

An Aluminum (Al) layer 550 in the contact hole 522 and on an upper surface of the Ti-rich TiN layer 540 can be formed using Chemical Vapor Deposition (CVD) in-situ with the formation of the Ti-rich TiN layer 540. It will be understood that the CVD-Al layer 550 can be grown at variable rates inside the contact hole 522 due to the relative number of nucleation sites in the underlying barrier metal layer 530 at the bottom of the contact hole 522 compared to the different portions of Ti-rich TiN layer 540 in the contact hole 522.

In other words, in some embodiments according to the invention, the CVD-Al layer 550 may be more rapidly formed on the partially exposed Ti/TiN layer 530 at the bottom of the contact hole 522 (or thin portions of the Ti-rich TiN layer 540) due to the relatively large number of nucleation sites provide by this type of layer compared to a thicker portion of the layer 540. Furthermore, the CVD-Al layer 550 may be more slowly formed on the sidewall approaching the opening of the contact hole 522 due to the increasing concentration and/or thickness of $N_2$ therein. In some embodiments according to the invention, the CVD-Al layer 550 may be formed on the Ti-rich TiN layer 540 at a rate that is indirectly proportional to the thickness of the Ti-rich TiN layer 540 and/or to the concentration of nitrogen in the Ti-rich TiN layer 540.

Therefore, the CVD-Al layer may be initially deposited more rapidly at the bottom of the contact hole 522 rather than nearer the opening of the contact hole 522 and outside the contact hole 522 thereby depositing the CVD-Al from the bottom of the contact hole 522 toward the opening, which may avoid the types of problems discussed above in reference to conventional approaches.

Figure 6:
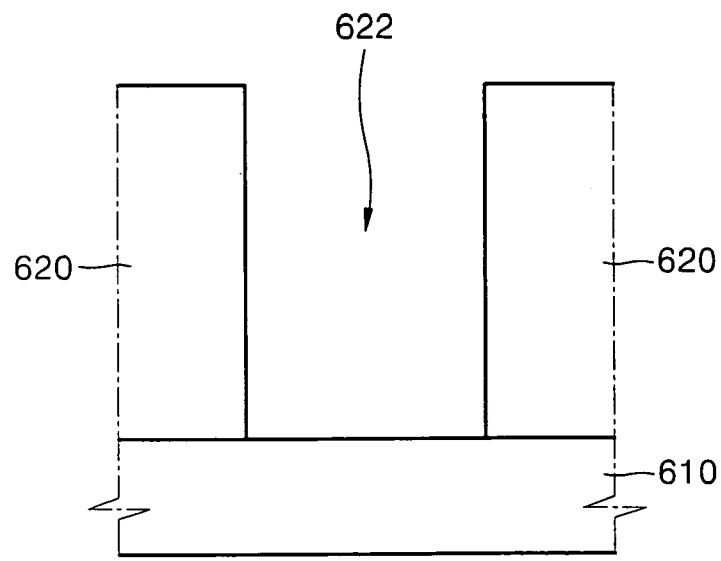
FIGS. 6-7 are cross sectional illustrations that illustrate the formation of a first metal barrier layer in a contact hole according to some embodiments in the invention.
Figure 7:
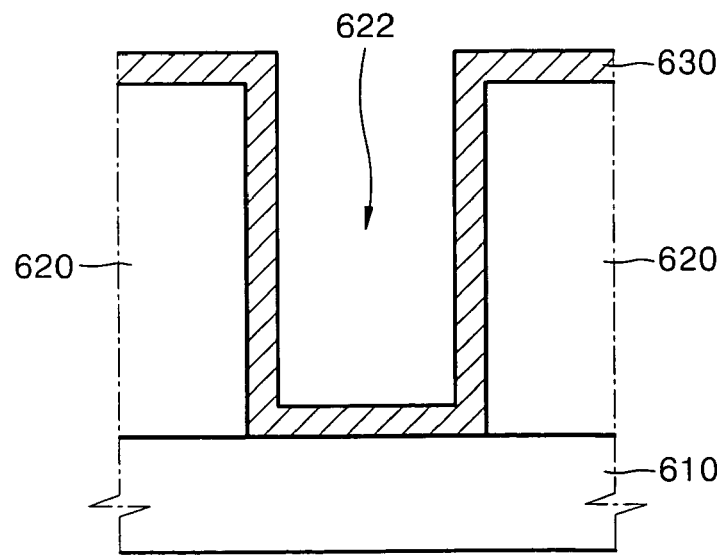

FIGS. 6-7 are cross-sectional views that illustrate the formation of a contact hole in a substrate according to some embodiments of the invention. In particular, as shown in FIG. 6, a patterned interlayer dielectric layer 620 is formed on a substrate 610 providing a contact hole 622 that exposes a portion of the substrate 610 therein. Although FIG. 6 shows a contact hole 622, it will be understood that the embodiments discussed herein may be equally applicable to a more generic "recess" such as a trench or a hole in interlayer dielectric layer.

According to FIG. 7, a metal barrier layer 630 is formed in the contact hole 622 to provide, for example, an adhesion layer for subsequently formed layers deposited thereon. In some embodiments according to the invention, the metal barrier layer 630 is a Ti/TiN (i.e., a multi-layered barrier metal layer including layers of Ti and TiN). The Ti and TiN layers can be formed using CVD, Physical Vapor Deposition (PVD), and/or Atomic Layer Deposition (ALD). In some embodiments according to the invention, the Ti/TiN layer can be formed using plasma CVD with $TiCl_4$ to form the Ti, whereas the TiN layer can be formed via CVD with $TiCl_4$ as the Ti source and $NH_3$ as the nitrogen source.

Figure 8:
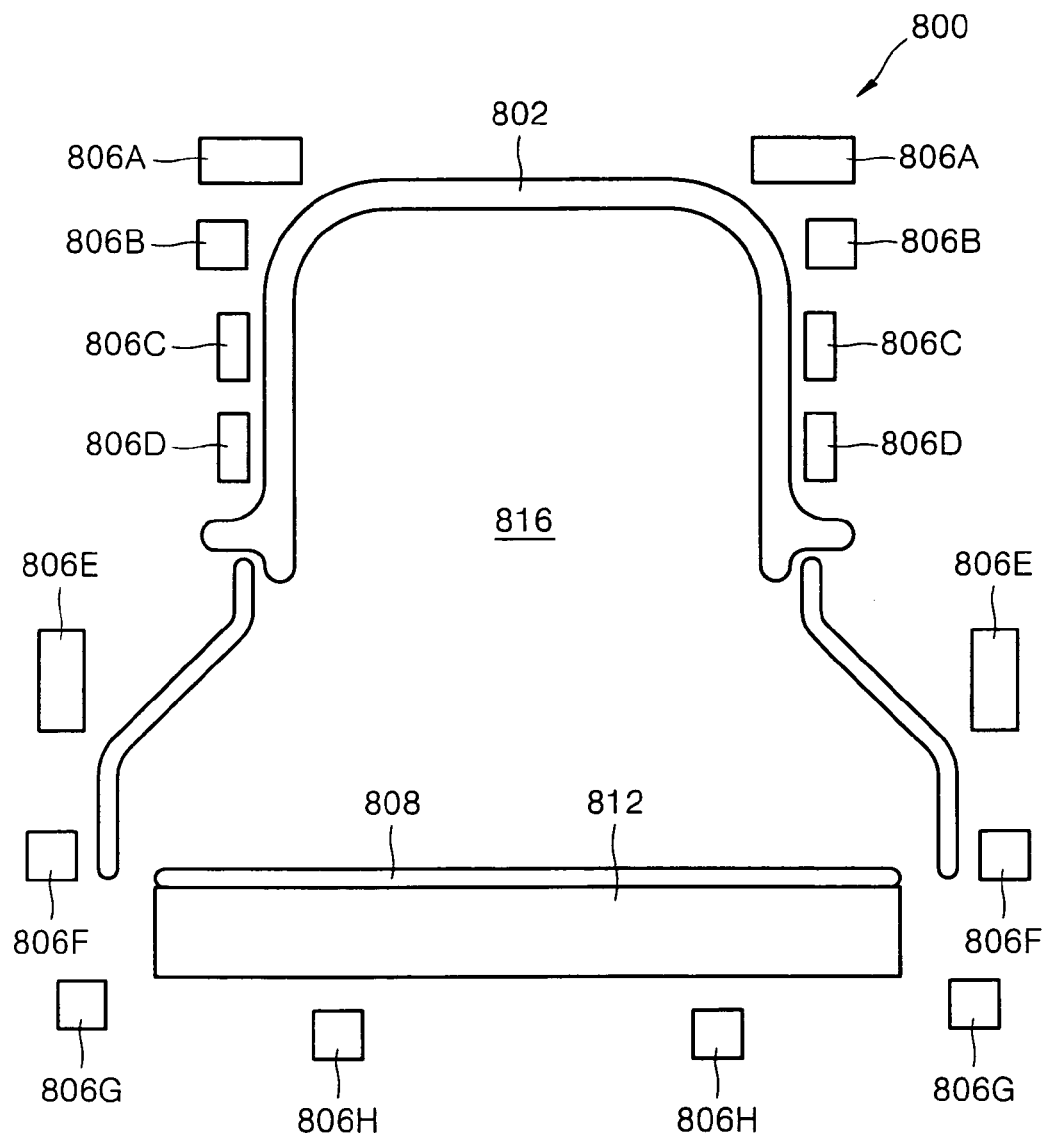
FIG. 8 is a schematic illustration of an HCM sputtering apparatus that can be used in a metallic mode to form metal-nitride barrier layers according to some embodiments in the invention.

FIG. 8 is a schematic representation of an HCM sputtering apparatus 800 operated in metallic mode used to fabricate Ti-rich TiN layers in contact holes according to some embodiments of the invention. In some embodiments according to the invention, a substrate 810 including a patterned inter-layer dielectric layer with a metal barrier layer therein is placed in an inner region 816 of the HCM sputtering apparatus 800. The HCM sputtering apparatus 800 includes a "cupped" Ti target 802 surrounded by electromagnets 806A-H. In operation according to some embodiments of the invention, the substrate 810 is maintained at a temperature between about 250° C. and 350° C. during the sputtering of the Ti target 802. Ar and $N_2$ gasses are provided to the inner region 816 at different rates. Furthermore, in some embodiments according to the invention, a cathode associated with the cupped TiN target 802 is maintained at a power of about 20 to about 40 Kilowatts during the deposition process.

Figure 9:
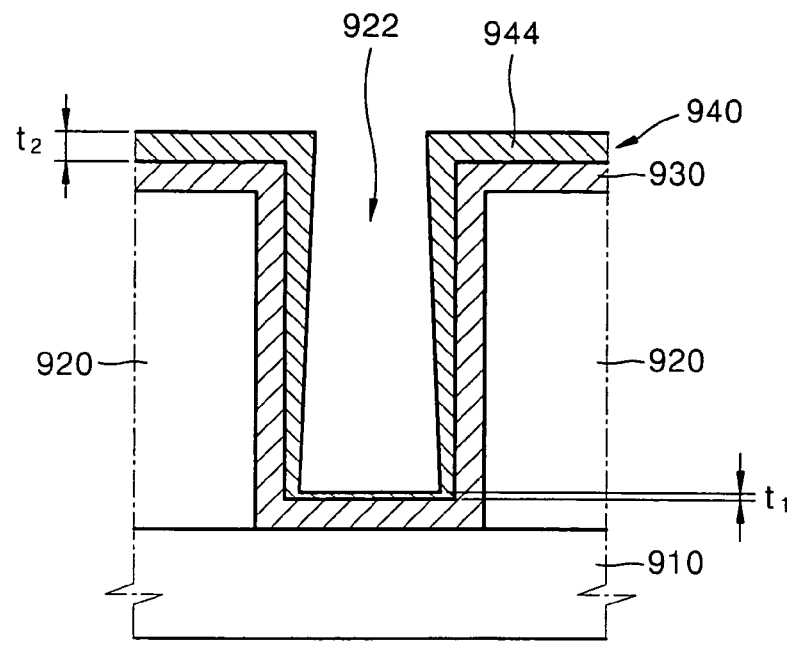
FIGS. 9-14 are cross sectional views that illustrate the formation of a contact hole having a second metal-nitride barrier layer with a tapered thickness formed according to some embodiments of the invention.
Figure 10:
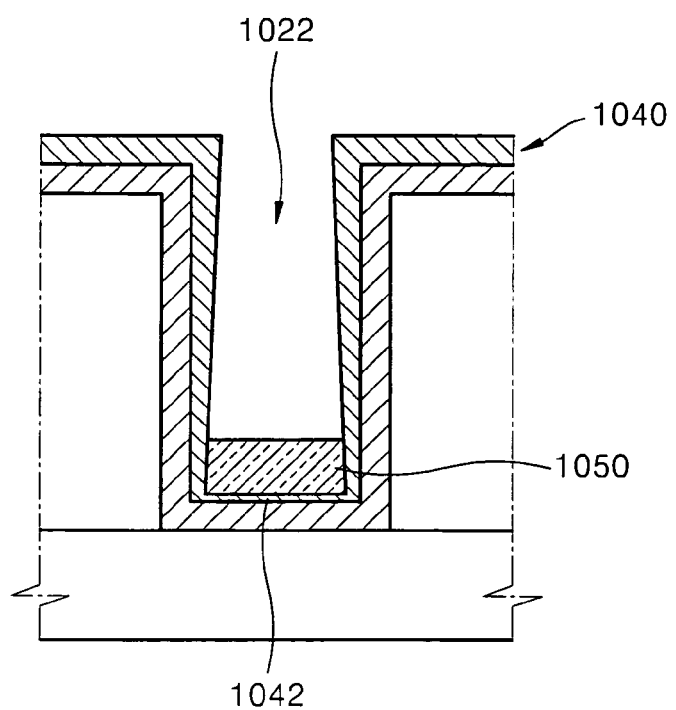
Figure 11:
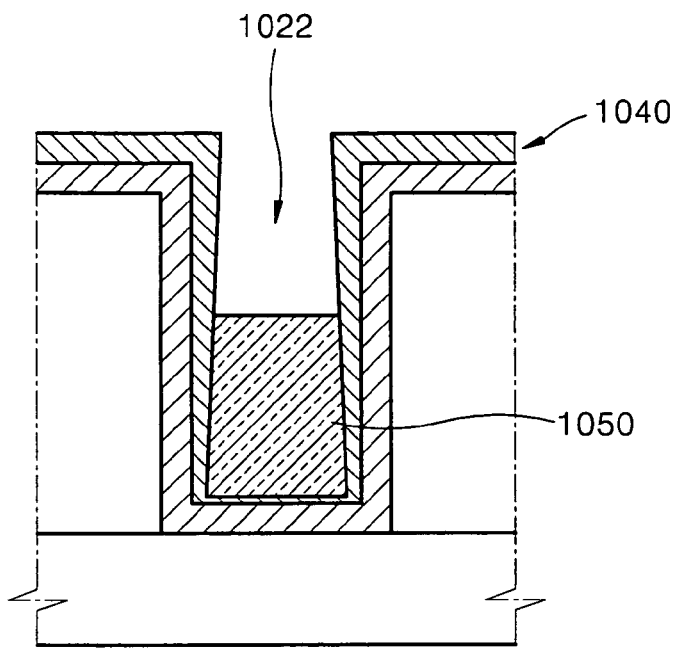

In some embodiments according to the invention, the rate at which Ar gas is provided to the inner region 816 is greater than the rate at which the $N_2$ gas is provided, thereby allowing the formation of the Ti-rich TiN layer in the contact holes of the substrate 810 (referred to herein as operating in "metallic mode"), such that more Ti than $N_2$ is included in the TiN layer The deposition can produce a tapered thickness Ti-rich TiN layer 940 with varied concentration of $N_2$ therein as shown in FIG. 9. It will be understood that a Ti-rich Ti N layer 940 is thicker outside a contact hole 922 (i.e., closer to the Ti target) than inside the contact hole 922 (and primarily at the bottom of the contact hole 922) due to the fact that the bottom of the contact hole 922 is farther from the Ti target than the portions outside the contact hole 922. Accordingly, the portions of the Ti-rich TiN layer 940 outside the contact hole 922 are thicker than portions of the Ti-rich TiN layer 940 that are inside the contact hole 922 (and particularly the portions at the bottom of the contact hole 922).

Furthermore, in some embodiments according to the invention, the more remote portions of the Ti-rich TiN layer 940 inside the contact hole 922 have a lower concentration than $N_2$ therein also due to the fact that the portions of the Ti-rich TiN layer 940 in the contact hole 922 are more remote from the $N_2$ gas introduced into the inner region 816 and, therefore, may be exposed to less $N_2$ than portions that are closer to the Ti target. The portions of the Ti-rich TiN layer 940 that are exposed to lesser amounts of $N_2$ therefore have lower concentrations of $N_2$ therein relative to the portions of the Ti-rich TiN layer 940 outside the contact hole. Furthermore, the tapered profile of the Ti-rich Ti N layer 940 on the sidewall of the contact hole 922 also has a gradually decreasing concentration of $N_2$ therein extending from the opening of the contact hole 922 toward the bottom of the contact hole 922.

In some embodiments according to the invention, the concentration of $N_2$ and the thickness of the Ti-rich TiN layer 940 depends on the duration of the deposition of the TiN layer. In some embodiments according to the invention, the concentration of $N_2$ in the Ti-rich Ti N layer 940 can also depend on the relative flow rates of the process gasses as well as the power applied to the cathode associated with the TiN target. In further embodiments according to the invention, the sputtering of the Ti target is performed for about 3.0 to about 10.0 seconds, and preferably for about 4.0 to about 6.0 seconds.

These process times can promote the formation of the Ti-rich TiN layer 940 so that the thickness at the bottom of the contact hole is about 10% of (or less than) the thickness of the Ti-rich TiN layer 940 outside the contact hole 922. For example, in some embodiments according to the invention, the thickness of the Ti-rich Ti N layer 940 at the bottom of the contact hole 922 is thin enough to expose the underlying CVD-Ti/TiN metal barrier layer (or about 5.0 Angstroms or less in places at the bottom) whereas the thickness of the Ti-rich TiN layer 940 outside the contact hole is about 50.0 Angstroms thick.

FIGS. 10-14 are cross-sectional views illustrating the formation of a CVD-Al layer 1050 in a contact hole 1022 formed according to some embodiments of the invention. In particular, the cross-sections shown in FIGS. 10-14 can be formed using a CVD-Al deposition process on the Ti-rich TiN layer 940 shown in FIG. 9. In some embodiments according to the invention, the substrate is moved from the inner region 816 to the CVD chamber without a vacuum break so that the CVD-Al layer 1050 can be formed in-situ. The CVD-Al process can be performed at a temperature of about 120° C. to about 130° C. and preferably at about 125° C. The CVD-Al deposition can be performed at a pressure of about 5.0 torr to about 10.0 torr, and preferably at about 9.0 torr. The carrier gas can be Ar provided at a flow rate of about 300 sccm to about 500 sccm, where the CVD-Al layer 1050 is formed using Metal Organic Chemical Vapor Deposition (MOCVD). The Al source can be Methylpyrrolidine alane (MPA), Dimethylethylamine alane (DMEAA), Dimethylaluminum hydride (DMAH) and/or Trimethylamine alane (TMAA).

Figure 12:
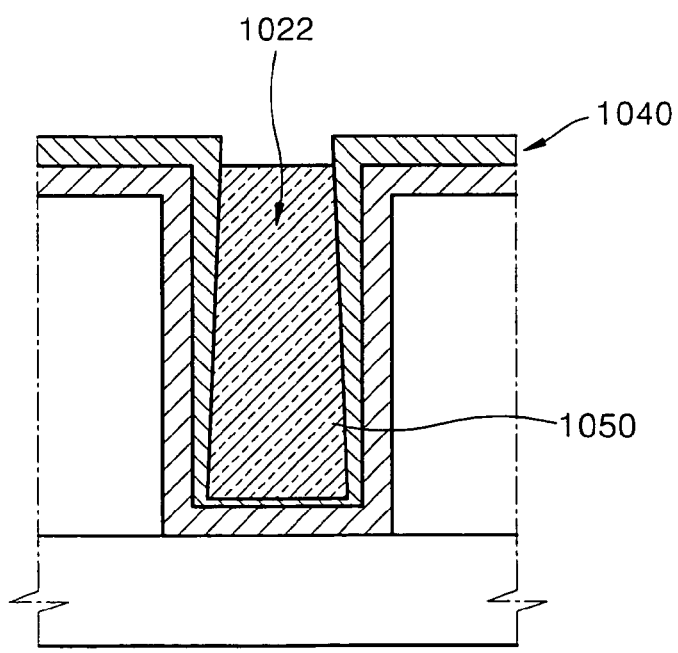

The relatively high number of nucleation sites included in the thin portions of the Ti-rich TiN layer 1040 (that effectively can expose the underlying CVD-Tin/TiN barrier layer) can promote the deposition of the CVD-Al 1050 starting at the bottom of the contact hole 1022 and progressing toward the opening of the contact hole 1022 as shown in FIG. 12.

Figure 13:
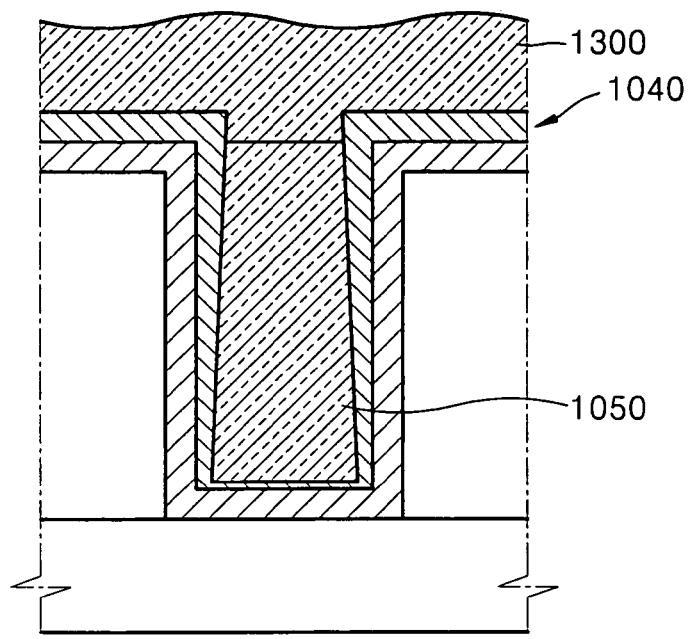
Figure 14:
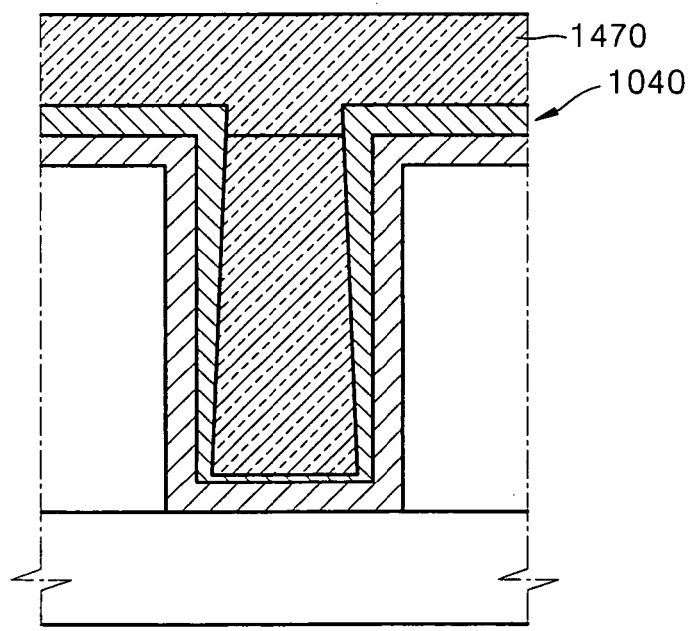
Figure 15:
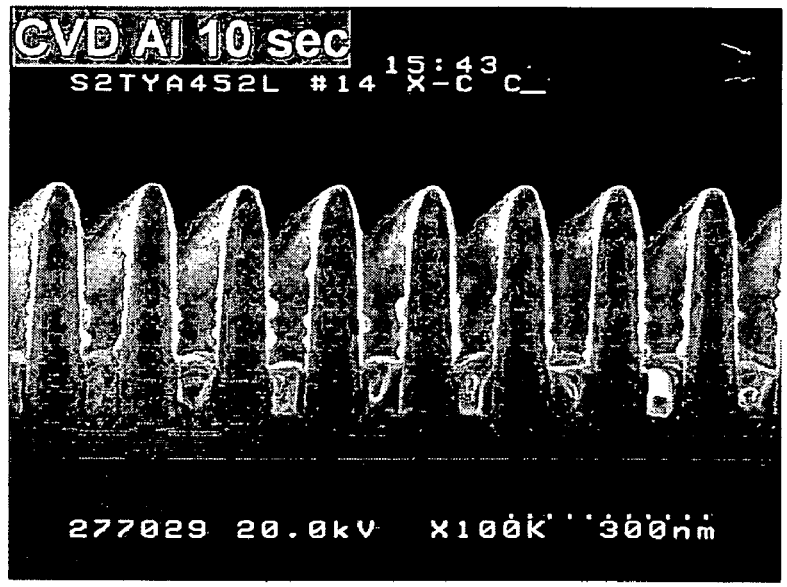
FIGS. 15-25 are scanning electron microscopy photographs of exemplary contacts formed according to some embodiments in the invention
Figure 16:
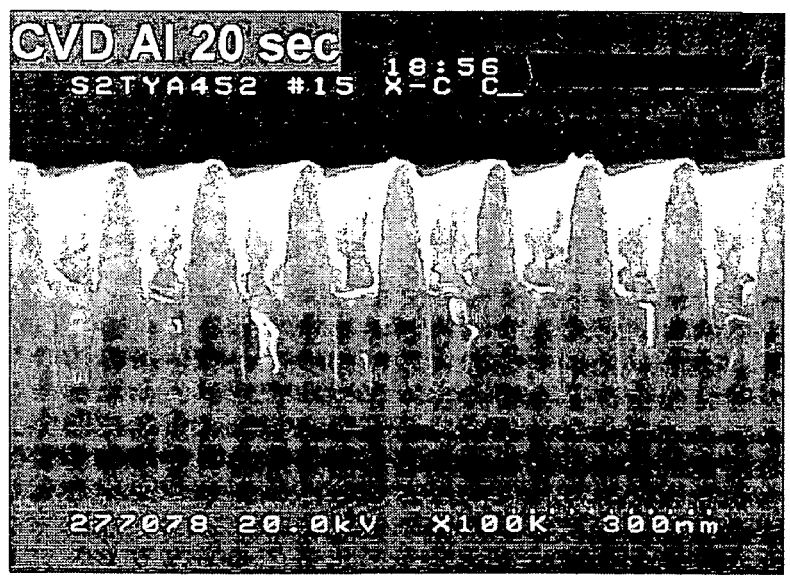
Figure 17:
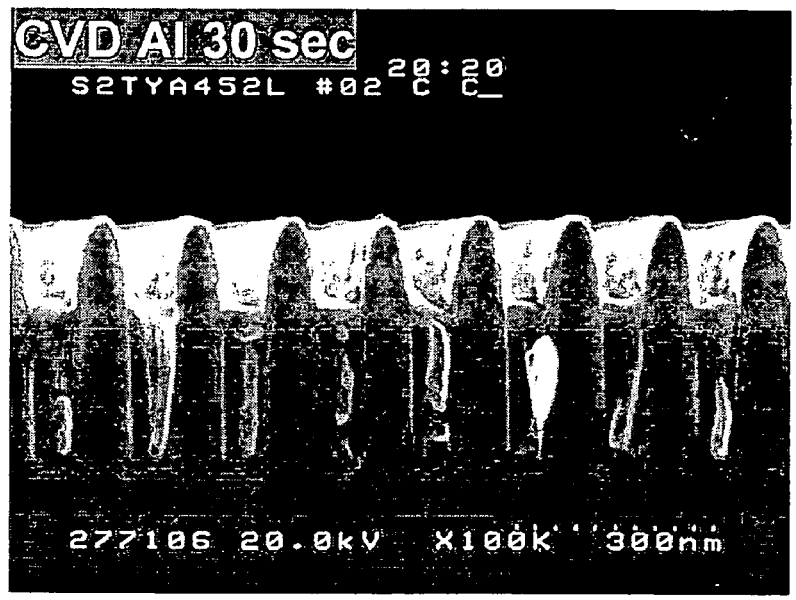

In some embodiments according to the invention, a metal layer 1360, such as an Al or an Al alloy, is formed on the CVD-Al 1050 which is heated at a temperature of about 350° C. to about 500° C. as shown in FIG. 13. The reflowed metal layer 1360 is planarized to provide a metal wiring layer 1470 as shown in FIG. 14.

FIG. 15-18 are Scanning Electron Microscopy (SEM) photographs showing selective deposition of CVD-Al in contact holes formed according to some embodiments of the invention. The exemplary samples shown in FIGS. 15-18 were formed at a critical dimension of 70 nm and a contact having a depth of about 350 nm. A Ti/TiN barrier layer was formed on an interlayer dielectric pattern including a contact hole using plasma CVD and a thermal CVD process using $TiCl_4$ and $NH_3$ as $T_1$ and $N_2$ sources, respectively.

A Ti-rich TiN layer was formed in the contact hole using metallic mode HCM as disclosed above. The CVD-Al layer was formed on the Ti-rich TiN layer in-situ. In particular, FIGS. 15-18 show the CVD-Al deposition at intervals of 10 seconds, 20 seconds, 30 seconds, and 40 seconds respectively. Further, FIGS. 15-18 show that the CVD-Al layer was deposited initially at the bottom of the contact hole (see FIG. 15) and proceeded toward the opening thereof (see FIG. 18). Ar and $N_2$ gasses were supplied to the HCM apparatus at respective rates of 135 sccm and 28 sccm. Furthermore, the sputtering process used to form the Ti-rich TiN layer was carried out for about 5.0 seconds.

Figure 18:
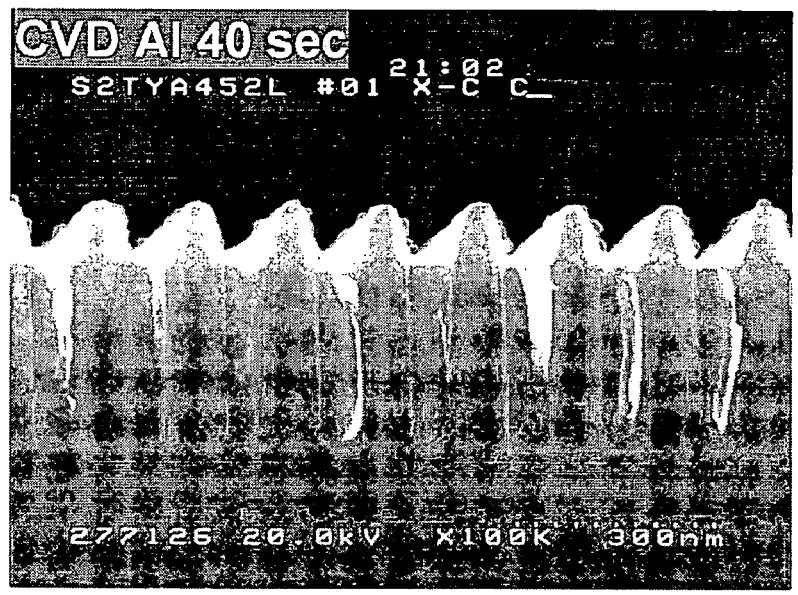
Figure 19:

FIG. 19 is a SEM photograph that illustrates the formation of a PVD-Al layer reflowed onto the structure shown in FIG. 18. As shown in FIG. 19, the inside of the recessed area was filled with CVD-Al without any apparent voids.

Figure 20A:
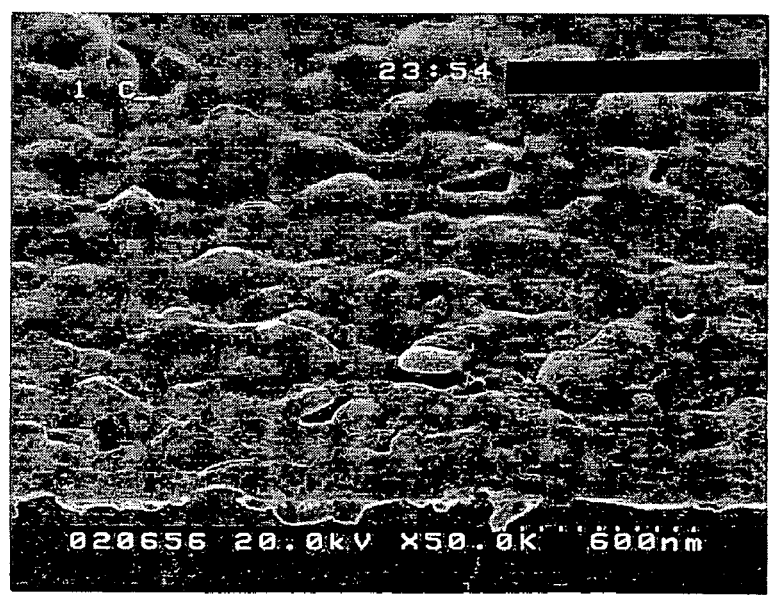
Figure 20B:
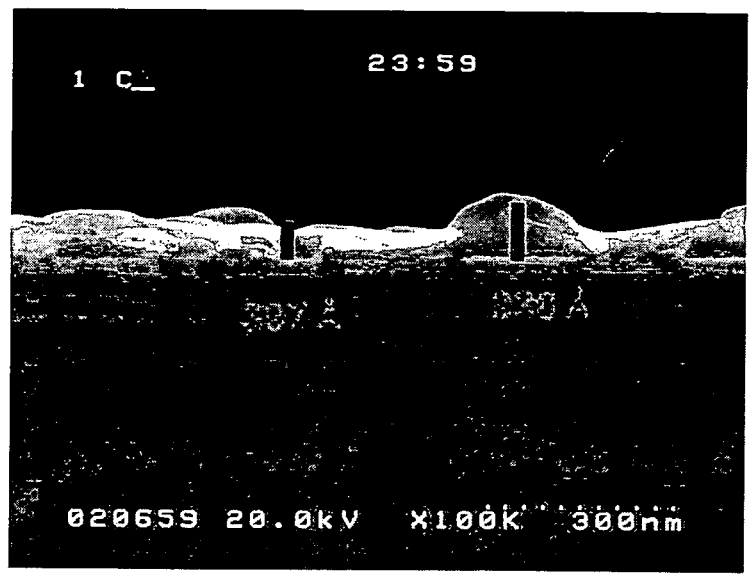

FIGS. 20A and 20B show experimental results in evaluating the formation of the CVD-Al layer. In particular, FIGS. 20A and 20B show the surface morphology of a CVD/Al layer in the contact hole (after formation of the CVD-Ti/TiN layer in the recess as the metal barrier layer). The CVD-Ti/TiN layer was formed using a plasma CVD process and thermal processing using $TiCl_4$ as the Ti source and $NH_3$ as the $NH_2$ source.

Figure 21A:
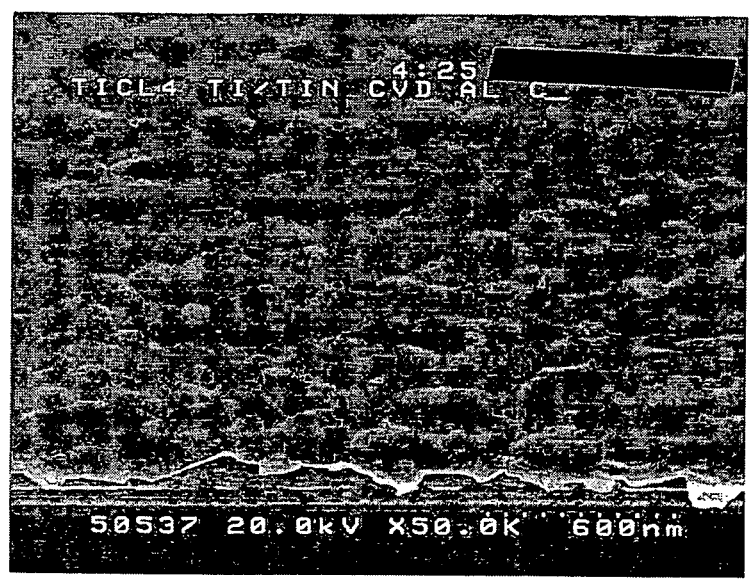
Figure 21B:

FIGS. 21A and 21B show experimental results in evaluating the formation of the CVD-Al layer. In particular, FIGS. 21A and 21B show the surface morphology resulting from of the formation of a Ti-rich TiN layer and a CVD-Al layer thereon. The experimental results illustrated in FIGS. 20A-21B show that, in some embodiments according to the invention, the CVD-Al may be more readily formed on the CVD-Ti/TiN layer that is partially exposed at the bottom of the contact hole compared to on the Ti-rich TiN layer due to the relative number of nucleation sites provided by each of the different types of layers.

In other words, the CVD-Al layer may be more rapidly formed on the partially exposed CVD-Ti/TiN at the bottom of the contact hole due to the relatively large number of nucleation sites provide by this type of layer compared to the Ti-rich TiN layer. Therefore, the CVD-Al layer is initially deposited at the bottom of the contact hole rather than near the opening of the contact hole and outside the contact hole thereby depositing the CVD-Al from the bottom of the contact hole toward the opening which may avoid the types of problems discussed above in reference to conventional approaches. As discussed above, the Ti-rich TiN layer is formed in a relatively short period of time during the Ti sputtering which may lead to the partial exposure of the underlying CVD-Ti/Ti N layer at the bottom of the contact hole, whereas the CVD-Ti/TiN layer located near the opening of the contact hole may be more completely covered by the Ti-rich Ti N layer formed by the Ti sputtering.

Figure 22:
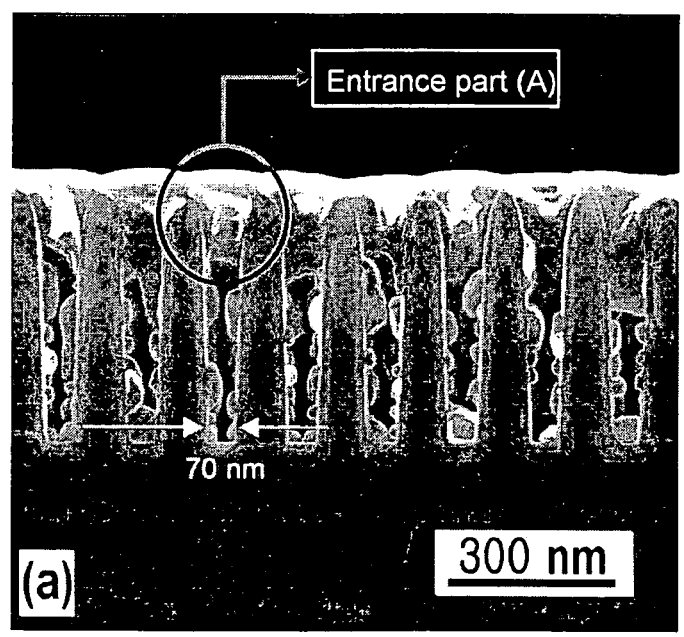
Figure 23:
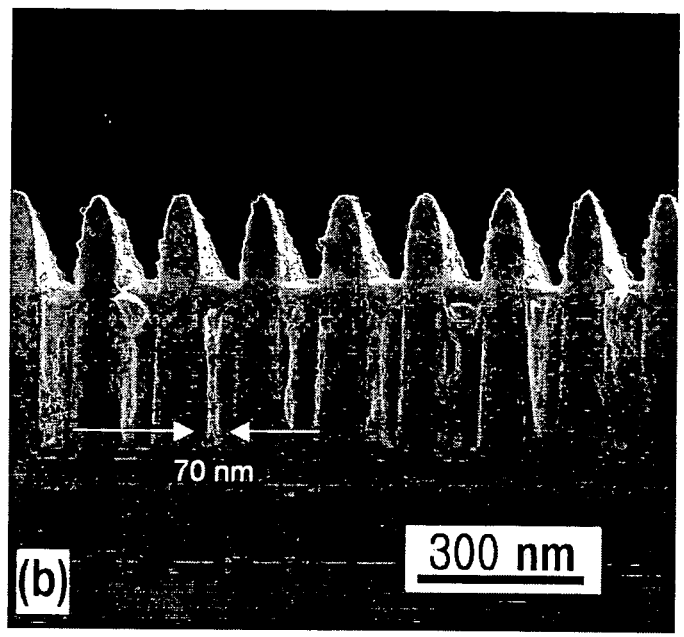

FIGS. 22 and 23 are cross-sectional SEM photographs of the CVD-Al material deposited on a contact hole according to a conventional approach and according to some embodiments of the invention respectively. According to FIG. 22, a conventional wetting layer (CVD-Ti/TiN) having a thickness of about 150 Angstroms was formed on an interlayer dielectric pattern and a CVD-Al layer was formed on the CVD-Ti/TiN layer. As shown in FIG. 22, the opening of the contact hole may be "pinched off" before the CVD-Al layer is deposited at the bottom of the contact hole because the CVD-Al layer is grown relatively quickly near the opening of the contact hole.

In contrast, as shown in FIG. 23, a Ti-rich TiN layer was formed, according to an embodiment of the invention, in the contact hole thereby allowing the deposition of the CVD-Al to proceed more readily at the bottom of the contact hole rather than near the opening of the contact hole to promote the deposition of the CVD-Al from the bottom of the contact hole toward the opening over time thereby allowing the formation of the CVD-Al layer in the contact hole with reduced voids.

Figure 24:
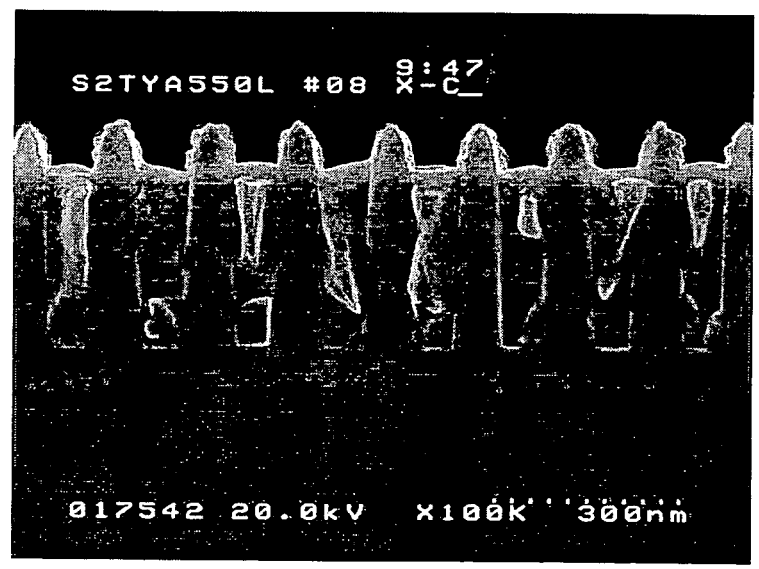
Figure 25:
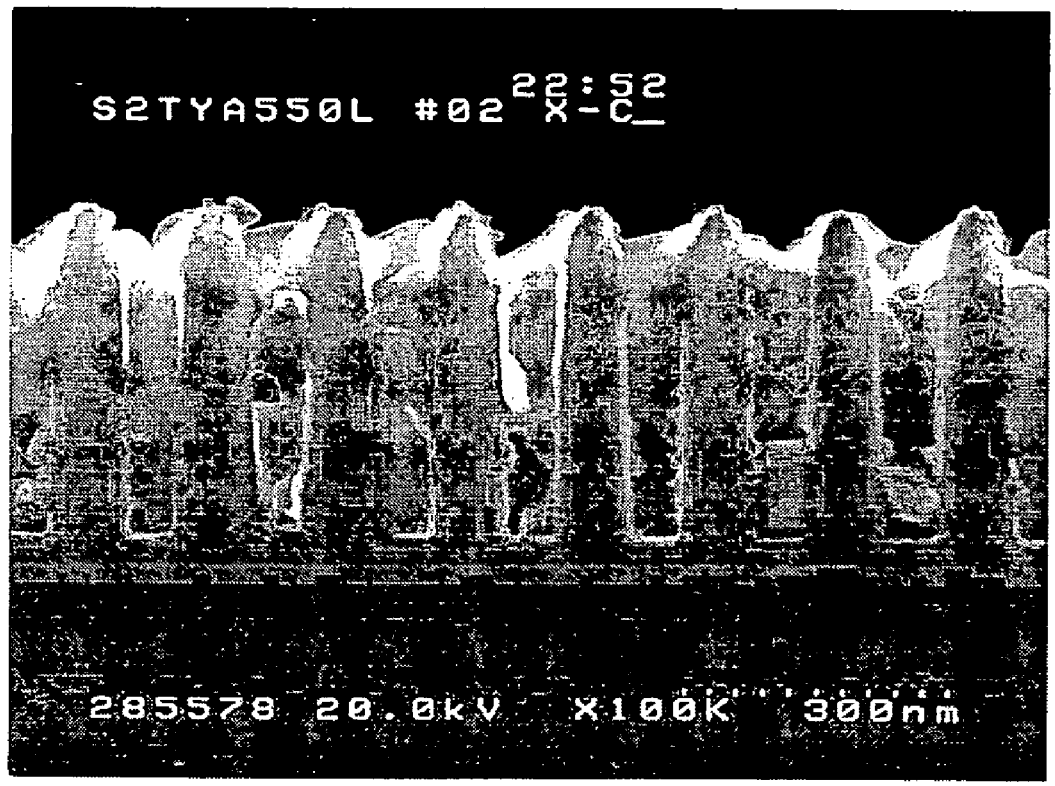

As shown in FIGS. 24 and 25, the CVD-Al layer was formed in the contact hole on the CVD-Ti/TiN layer and the Ti-rich TiN layer without a vacuum break and with a vacuum break respectively. In particular, FIG. 24 shows the CVD-Al layer was formed for about 5.0 seconds after the formation of the Ti-rich TiN layer in-situ (i.e., without a vacuum break between forming the CVD-Al and the Ti-rich TiN layer).

In contrast, FIG. 25 shows that a CVD-Al formed with a vacuum break after formation of the Ti-rich TiN layer. Therefore, the differences in the structures shown in FIGS. 24 and 25 illustrate the relative benefits that may be provided with the CVD-Al layer formed without a vacuum break between the formation of the Ti-rich TiN layer and formation of the CVD-Al layer.

As disclosed herein, in some embodiments according to the invention, relatively thin portions of a metal-nitride layer (e.g., portions having a thickness of about 5.0 Angstroms or less) and/or portions having relatively low concentrations of nitrogen compared to other portions, can provide a relatively large number of nucleation sites. The relatively large number of nucleation sites can promote the subsequent formation of a CVD-Al layer at the bottom of the contact hole to reduce the likelihood that growth of the CVD-Al layer near the opening of the contact hole will close the contact hole before the formation of the CVD-Al inside the contact hole is complete (i.e., fills any void in the contact hole 522).

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming a metal layer in an integrated circuit comprising:

forming a metal-nitride layer in a recess including a first concentration of nitrogen in the metal-nitride layer at a bottom of the recess that is less than a second concentration of nitrogen in the metal-nitride layer proximate an opening of the recess; and forming a metal layer on the metal-nitride layer including in the recess wherein the metal layer is formed directly on a portion of the metal-nitride aver having, the first concentration of nitrogen at the bottom of the recess; wherein forming a metal-nitride layer comprises forming the metal-nitride layer with a tapered thickness including a first thickness at the bottom and a second thickness approximate the opening, wherein the first thickness is less than or equal to the about 10 percent of the second thickness.

2. A method according to claim 1 wherein forming a metal-nitride layer comprises forming the metal-nitride layer using W, Ti, and/or Ta.

3. A method according to claim 1 wherein forming a metal-nitride layer comprises sputtering a titanium target for a time interval of about 3.0 seconds to about 10.0 seconds.

4. A method according to claim 1 wherein forming a metal-nitride layer comprises sputtering a titanium target using a Hollow Cathode Magnetron in metallic mode for a time interval of about 4.0 seconds to about 6.0 seconds.

5. A method according to claim 1 wherein forming the metal-nitride layer with a tapered thickness comprises forming the metal-nitride layer to provide the second thickness of about 50 Angstroms or less and the first thickness of about 5.0 Angstroms or less.

6. A method according to claim 1 wherein forming a metal-nitride layer comprises forming the metal-nitride layer with a tapered thickness including a first thickness at the bottom and a second thickness that is greater than the first thickness proximate the opening.

7. A method according to claim 6 wherein the tapered thickness of the metal-nitride layer comprises a gradually reducing thickness as the metal-nitride layer extends from the bottom toward the opening.

8. A method according to claim 1 wherein forming a metal-nitride layer comprises forming a Ti-rich TiN layer in the recess using metallic mode Hollow-Cathode-Magnetron (HCM) sputtering.

9. A method according to claim 8 wherein forming a Ti-rich TiN layer in the recess using metallic mode further comprises:
introducing Ar and $N_2$ during the HCM sputtering at different flow rates.

10. A method according to claim 8 wherein forming a Ti-rich TiN layer in the recess using metallic mode further comprises:
introducing Ar gas at a flow rate that is greater than a flow rate of $N_2$ gas during sputttering.

11. A method according to claim 10 wherein introducing Ar gas at a flow rate that is greater than a flow rate of $N_2$ gas during sputtering comprises introducing Ar at a rate of about 135 sccm and introducing $N_2$ at about 28 sccm.

12. A method according to claim 8 wherein forming a Ti-rich TiN layer in the recess using metallic mode Hollow-Cathode-Magnetron (HCM) sputtering further comprises maintaining a cathode associated with a Ti target at a power of about 20 Kilowatts to about 40 Kilowatts.

13. A method according to claim 1 wherein forming a metal-nitride layer further comprises:
maintaining a temperature of about 250° C. and about 350° C. in an HCM inner region.

14. A method according to claim 1 wherein forming a metal layer comprises forming a CVD-Al layer without a vacuum break relative to forming the metal-nitride layer.

15. A method according to claim 1 wherein forming a metal layer comprises forming a CVD-Al layer at a temperature of about 120° C. to about 130° C. and at a pressure of about 5.0 torr to about 10.0 torr and Ar gas provided at a flow rate of about 300 sccm to about 500 sccm.

16. A method according to claim 1 wherein forming a metal-nitride layer comprises:
sputtering a Ti target onto a substrate including the recess using a greater flow of Ar compared to $N_2$ for a time interval between about 4 and 10 seconds; and
ceasing sputtering the Ti target after the time interval elapses.

17. A method of forming a metal layer in an integrated circuit comprising:
forming a TiN wetting layer in a recess of a substrate including a first concentration of N2 in the wetting layer at a bottom of the recess that is less than a second concentration of N2 in the wetting layer proximate an opening of the recess; and
forming a metal layer on the TiN wetting layer using Chemical Vapor Deposition wherein the metal layer is formed directly on a portion of the TiN wetting layer having the first concentration of N2 at the bottom of the recess.

18. A method according to claim 17 wherein forming a TiN wetting layer comprises sputtering a titanium target for a time interval of about 3.0 seconds to about 10.0 seconds; and
ceasing sputtering the target after the time interval.

19. A method according to claim 18 wherein forming a Ti wetting layer comprises:
introducing Ar and $N_2$ gas at different flow rates during metallic mode HCM sputtering.

20. A method according to claim 18 wherein forming a TiN wetting layer further comprises:
introducing Ar gas at a flow rate that is greater than a flow rate of $N_2$ gas.

21. A method according to claim 20 wherein introducing Ar gas at a flow rate that is greater than a flow rate of $N_2$ gas during sputtering comprises introducing Ar at a rate of about 135 sccm and introducing $N_2$ at about 28 sccm.

22. A method according to claim 18 wherein forming a TiN wetting layer further comprises:
maintaining a cathode associated with a Ti target at a power of about 20 Kilowatts to about 40 Kilowatts.

23. A method according to claim 17 wherein forming a metal layer comprises: forming a CVD-Al layer at a temperature of about 120° C. to about 130° C. and at a pressure of about 5.0 torr to about 10.0 torr and Ar gas provided at a flow rate of about 300 sccm to about 500 sccm.

24. A method of forming a metal layer in an integrated circuit comprising:
forming a metal-nitride layer in a recess in a substrate;
sputtering a metal target onto the substrate in an $Ar/N_2$ environment including a relatively high concentration of Ar compared to $N_2$ to form a metal-rich metal-nitride layer in the recess having a first concentration of $N_2$ at a bottom that is less than a second concentration of $N_2$ at an opening of the recess; and
depositing a metal layer in the recess on the metal-rich metal-nitride layer using Chemical Vapor Deposition without vacuum break relative to the sputtering wherein the metal layer is formed directly on a portion of the metal nitride layer having the first concentration of $N_2$ at the bottom of the recess.

25. A method according to claim 24 wherein sputtering comprises sputtering a titanium target for a time interval of about 3.0 seconds to about 10.0 seconds; and
ceasing sputtering the target after the time interval.

26. A method according to claim 24 wherein sputtering further comprises:
introducing the Ar at a flow rate that is greater than a flow rate of $N_2$ during sputtering.

27. A method according to claim 26 wherein introducing further comprises introducing the Ar at a rate of about 135 sccm and introducing the $N_2$ at about 28 sccm.

28. A method according to claim 24 wherein sputtering comprises sputtering the metal target using metallic mode Hollow-Cathode-Magnetron (HCM) sputtering maintaining a cathode associated with target at a power of about 20 Kilowatts to about 40 Kilowatts.

29. A method according to claim 28 wherein sputtering further comprises:
maintaining a temperature of about 250° C. and about 350° C. in an HCM inner region.

30. A method according to claim 24 wherein sputtering further comprises:
depositing the metal layer in different portions of the recess at different rates.

31. A method according to claim 30 wherein depositing further comprises:
depositing the metal layer at the different rates indirectly proportional to a thickness of the metal-rich metal nitride layer in the recess.

* * * * *